(12) United States Patent
Menezo

(10) Patent No.: US 6,690,859 B2
(45) Date of Patent: Feb. 10, 2004

(54) DEVICE FOR COMPARING WAVELENGTH VALUES AND MULTIPLEXING AND A SYSTEM FOR MONITORING MONOCHROMATIC SOURCES

(75) Inventor: Sylvie Menezo, Montrouge (FR)

(73) Assignee: Avanex Corporation, Fremont, CA (US)

( * ) Notice: Subject to any disclaimer, the term of this patent is extended or adjusted under 35 U.S.C. 154(b) by 309 days.

(21) Appl. No.: 09/748,024

(22) Filed: Dec. 27, 2000

(65) Prior Publication Data

US 2001/0005438 A1 Jun. 28, 2001

(30) Foreign Application Priority Data

Dec. 28, 1999 (FR) .............................. 99 16605

(51) Int. Cl.[7] ................................................ G02B 6/34
(52) U.S. Cl. ........................................ 385/37; 385/24
(58) Field of Search ........................... 385/24, 37, 30, 385/15, 31, 124, 127, 128, 130

(56) References Cited

U.S. PATENT DOCUMENTS 5,745,270 A * 4/1998 Koch ........................ 359/124

6,389,201 B1   5/2002 Urino

FOREIGN PATENT DOCUMENTS

| EP | 0 703 679 A2 | 3/1996 | |
|---|---|---|---|
| EP | 0 798 882 A2 | 10/1997 | |
| EP | 0 933 664 A2 | 8/1999 | |
| JP | 10 303 815 A | 11/1998 | |
| JP | 10-303815 | * 11/1998 | ........... H04B/10/02 |

* cited by examiner

Primary Examiner—Frank G. Font
Assistant Examiner—Michael P. Mooney
(74) Attorney, Agent, or Firm—Wilson Sonsini Goodrich & Rosati; Kenta Suzue

(57) ABSTRACT

A device for comparing between N nominal wavelength values ($\lambda ei$) and the wavelength values of optical signals coupled respectively with input ports (GEi) of a phasar with a grating (R) of guides (Gj), the said phasar comprising a main output port (GS (m) designed to collect the combination of the said signals, the said main output port (GS(m)) being placed at a focal point corresponding to a given interference order m of the grating, characterized in that the phasar comprises two secondary monitoring output ports (A, B) respectively placed in the vicinity of focal points corresponding to the interference orders m−1 and m+1 of the grating (R).

5 Claims, 4 Drawing Sheets

DEVICE FOR COMPARING WAVELENGTH VALUES AND MULTIPLEXING AND A SYSTEM FOR MONITORING MONOCHROMATIC SOURCES

BACKGROUND OF THE INVENTION

The invention relates to a device for comparing nominal wavelength values and wavelength values of optical signals coupled with the input ports of a multiplexer with a waveguide grating, the signals carried by the different wavelengths combining at an output port of the multiplexer.

The invention also relates to a system for monitoring monochromatic optical sources, serving notably to generate the signal carrier waves.

The comparison is made with a view to controlling the wavelength value of the optical sources used in order to effect wavelength multiplexing in telecommunications networks. The increase in density requirements of transmission channels in networks using wavelength multiplexing accentuates the importance of rapid control of the wavelengths of monochromatic sources and their stability; these wavelengths can undergo drift due to aging or variations in temperature of the monochromatic sources, for which generally lasers would be used. Nominal wavelength means the emission wavelength imposed on the laser. These nominal wavelengths correspond typically to standard values. Input port (or output port) generally means an input (or output) guide.

Amongst the different types of passive multiplexers known, consideration will be given hereinafter to those which use an angular dispersion element such as an etched diffraction grating or a grating formed by waveguides, connecting two couplers in a star. Hereinafter, the term phasar will be given to this type of multiplexer (referred to in English as "Phased Arrayed Waveguide Grating Multiplexer" or "AWG").

An example of a wavelength control device for the optical emitters of a phasar is proposed in the article "A wavelength matching scheme for multiwavelength optical links and networks using grating demultiplexers" by F. Tong et al, IEEE Photonics Technology Letters, vol 7, N° 6, June 1995. In the solution proposed, two transmission channels are dedicated to the comparison of the wavelengths.

In the article "Fabrication of multiwavelength simultaneous monitoring device using arrayed-waveguide grating", Electronics Letters, 14 March 1996, Vol. 32, N° 6, the authors K. Okamoto et al describe a device making it necessary to take off some of the N input signals in order to reintroduce them into the phasar and compare at the output the corresponding N signals detected on each side of the N main output signals. In addition to a few losses caused by taking off some of the N input signals, this solution makes it necessary to duplicate the input signals, an operation which is tedious to perform.

SUMMARY OF THE INVENTION

The aim of the invention is to propose a solution not having the drawbacks mentioned above.

A detailed analysis of the functioning of the phasar type envisaged in the invention and depicted in FIG. 1 shows that, for each wavelength value $\lambda i$ of the emission laser i, i varying from 1 to N, the optical wave constituting the input signal is coupled with an input guide GEi and undergoes the following operations:

- a diffraction in an input coupler CE, each guide Gj situated at the output surface SCE of the coupler receiving part of the diffracted wave,
- phase shifts in a grating R of M guides Gj, j varying from 0 to M, situated between the coupler CE and a coupler CS, the length of the guides Gj varying according to a linear function such that $LGj=LG0+j\Delta L$, $\Delta L$ being the difference in length between two adjacent guides; the phase differences forming, at the output of the grating R of guides, interferences which are constructive in a direction depending on the wavelength,
- a focusing, on the output surface SCS of the coupler CS, of the interferences of the waves issuing from the guides of the grating R.

The phasar according to the invention is designed so that the adjacent interference orders m−1, m and m+1 correspond to three focal points which form on the output surfaces SCS of the coupler CS for N given wavelengths, that is to say for the N wavelengths of the lasers used. The multiplexed signals resulting from the interferences at orders m−1 and m+1 of the grating R are used for the wavelength control; whilst the multiplexed signals resulting from the interferences at order m have the maximum power and correspond to the useful signal.

More precisely, the object of the invention is a device for comparing between N nominal wavelength values $\lambda ei$ and the wavelength values of optical signals coupled respectively with input ports GEi of a phasar with a grating R of guides Gj, the said phasar comprising a main output port GS(m) designed to collect the combination of the said signals, the said main output port GS(m) being placed at a focal point corresponding to a given interference order m of the grating, principally characterised in that the phasar comprises two secondary monitoring output ports (A, B) respectively placed in the vicinity of focal points corresponding to the interference orders m−1 and m+1 of the grating R.

Thus, with a single device, it is possible to fulfil the wavelength multiplexing function and a function of monitoring the wavelengths of the emission sources of the signals to be multiplexed. The proposed solution does not require duplication of the input signals. In addition, as the focal points for the orders m−1 and m+1 exist in any event in the usual phasars, they do not cause any additional loss.

Concerning the practical embodiment, an appropriate choice of the positions of the monitoring ports makes it possible to optimise the monitoring function. For this, the transmission functions TAi and TBi of the phasar defined respectively as the ratios of the optical powers present respectively at the outputs A and B to the optical power of the signal applied at the input port GEi, these power ratios being a function of the wavelength of the signal applied.

Thus, according to a characteristic of an embodiment of the invention, the positions of the secondary output ports A and B are adjusted so that the difference between the two transmission functions of the phasar TAi and TBi for the output ports A and B, called the discrimination function Di, is zero for all the nominal wavelength values $\lambda ei$ and bijective as a function of the wavelength value around the nominal value of the wavelength value most dispersed by the grating at orders m−1 and m+1. The bijective character means that, to each wavelength value taken around this nominal value, there corresponds a single value of the discrimination function Di and vice-versa.

The positions of the secondary output ports A and B can be adjusted so that, for all the wavelength values λei, the spectral difference Δλei between the wavelength value of the maximum of the transmission curve TAi and the wavelength value of the transmission curve TBi is situated at the upper limit of a minimum spectral difference Δλc determined experimentally. This condition ensures the bijective character of the discrimination function Di.

To allow electronic processing of the function Di, the two secondary output ports are coupled with photodetectors.

The invention also relates to a system for monitoring monochromatic sources Li, characterised in that it includes a comparison device as described above, whose input ports GEi are coupled respectively with the said sources, and control means CM for monitoring the wavelength of at least one of the said sources according to the electrical signals supplied by the said photodetectors.

BRIEF DESCRIPTION OF THE DRAWINGS

Other particularities and advantages of the invention will emerge clearly from a reading of the description given by way of non-limitative example with regard to the accompanying drawings, in which.

DESCRIPTION OFN THE PREFERRED EMBODIMENTS

Figure 1:
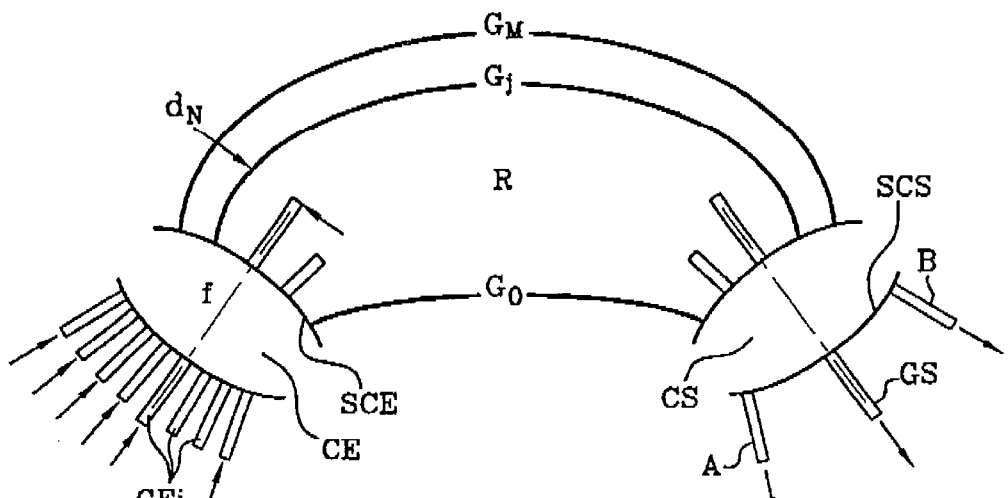
FIG. 1 depicts a schematic view of a phasar according to the invention.

FIG. 1 is a schematic view of a phasar. It consists of a first coupler CE in a star, whose input is connected to a plurality of input guides GEi. The output surface SCE of the coupler CE which is situated opposite the input guides GEi constitutes a surface for receiving input optical waves coupled with the guides GEi and whose wavelength it is wished to control. The output surface SCE is connected to a grating R of M guides Gj. The other end of the grating R is connected to a star coupler Cs. The output surface SCS of the coupler CS which is situated opposite the grating R constitutes a surface for receiving the waves issuing from R and is connected to three guides A, GS and B. The guide GS is allocated to the interference order m of the grating R, the guides A and B being respectively placed in the vicinity of the focal points for orders m−1 and m+1 of the grating R.

Figure 2:
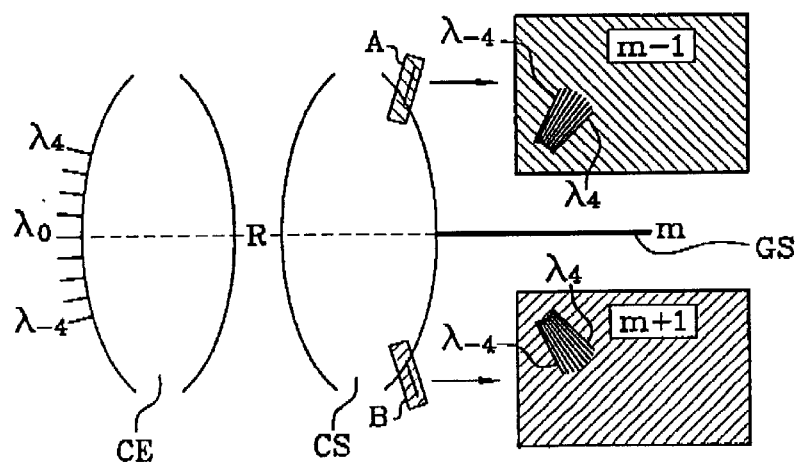
FIG. 2 shows in more detail the focal points of the interferences at orders m−1, m and m+1 of the grating, FIG. 3a) shows the correspondence between the wavelengths and the focal points at orders m−1, m and m+1 and the output ports A and B, FIG. 3b) depicts the curves of the transmission functions TGSi, TAi, TBi according to the wavelength, FIG. 3c) depicts on the one hand the curves of the transmission functions TAi and TBi of the phasar for the guides A and B placed in the vicinity of orders m−1 and m+1, and on the other hand the curve of the corresponding discrimination function Di.

The detail of the focal points of the interferences at orders m−1 and m+1 is presented in FIG. 2. For each of these two orders, the location of the focal points varies according to the wavelength λi (for example λ−4, ... Δ0, ..., λ+4) of each input signal; they are not located at the same point as is the case with order m. The focal point which is the most geometrically shifted with respect to the central position for the order in question corresponds to the most dispersed wavelength, an example of which is given in FIG. 2 under the reference λ−4.

Figure 3A:
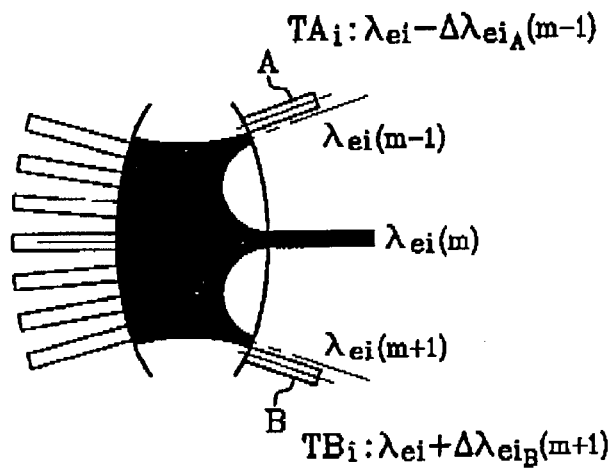

According to the invention and as indicated in FIG. 3a), two monitoring output guides A and B are added close to the focal points for the orders m−1 and m+1; A and B designate either the secondary output ports or the guides placed at these ports. In this figure there are also indicated the wavelengths of the multiplexed signals resulting from the interferences respectively formed at orders m−1, m and m+1 and at the centre of the ports A and B. The decentring of the guides A and B with respect to the exact positions of the focal points for orders m−1 and m+1 is however sufficiently small with respect to the coupling region of these guides for these to be able each to collect wavelengths of all the multiplexed signals (corresponding to the N wavelengths of the lasers used). A spectral shift denoted Δλei corresponds to the geometric shift of each of the guides A and B. ΔλeiA refers to the spectral shift between the nominal wavelength value λei and the wavelength value of the maximum of the transmission curve TAi at A. Likewise for ΔλeiB. The guides A and B are positioned so that ΔλeiA=ΔλeiB. Let Δλei= ΔλeiA+ΔλeiB.

Figure 3B:
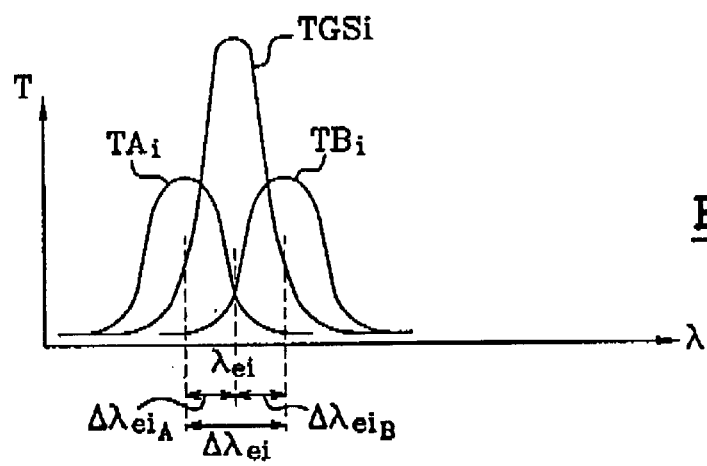

The transmission function T of this phasar, between an input guide and an output guide, also referred to as the transfer function in the literature, is expressed according to the wavelength by a function of the Gaussian type. FIG. 3b) illustrates the transmission function TGSi for GS and the transmission functions TAi and TBi for A and B. The positioning of the guides A and B with respect to the focal points for orders m−1 and m+1 is adjusted so that, when the transmission functions TAi at A and TBi at B are analysed on the same device, the intersection point of the curves representing TAi and TBi coincides with the nominal wavelength value λei. When the wavelength value emitted by the laser λi at the input of the guide GEi is identical to the nominal wavelength value λei, the difference between the two functions TAi and TBi is cancelled out. This difference is called the discrimination function Di and is expressed as a function of the wavelength. When the transmission wavelength value differs from the nominal wavelength value λei, the discrimination function Di takes a non-zero value, positive if it is greater than the nominal wavelength value λei, negative if it is lower. The wavelength drift of the corresponding transmission laser with respect to the required nominal wavelength values can then be derived.

Figure 3C:
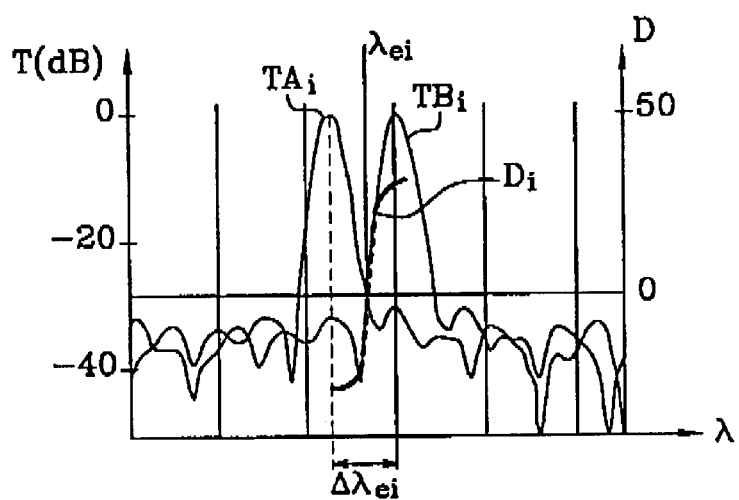

FIG. 3c) depicts the transmission functions TAi and TBi at the guides A and B placed in the vicinity of the focal points for orders m−1 and m+1 as well as the curve of the discrimination function Di.

Spectral control extent means the wavelength range for which the discrimination function Di is bijective. When the discrimination function is no longer bijective, the wavelength monitoring of the emission laser can no longer be achieved.

Figure 4:
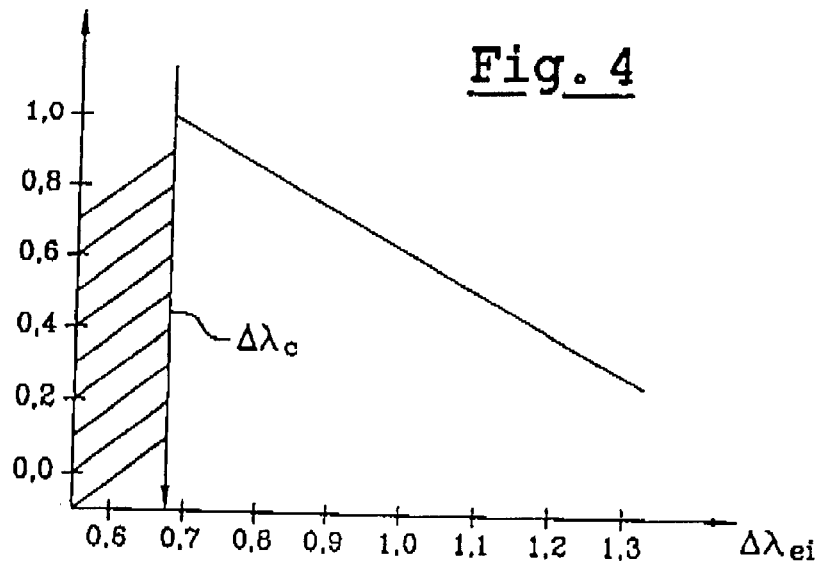
FIG. 4 depicts the control spectral extent according to the spectral difference introduced by the geometric shift of the secondary output ports with respect to the positions of the focal points for orders m−1 and m+1.

FIG. 4 depicts the spectral control extent, according to the spectral difference $\Delta\lambda ei$ introduced by the geometric decentring of the secondary output ports A and B. A hatched area is indicated on this figure for which, when the difference $\Delta\lambda ei<\Delta\lambda c$, the discrimination function Di is no longer bijective. The position of the guides A and B is optimised so that the spectral control extent is largest and is thus at the upper limit of this area. For the relationship $\Delta\lambda ei>\Delta\lambda c$ to be valid for all wavelength values $\lambda ei$, it suffices for it to be satisfied for the most dispersed wavelength value, $\lambda_{-4}$.

Figure 5:
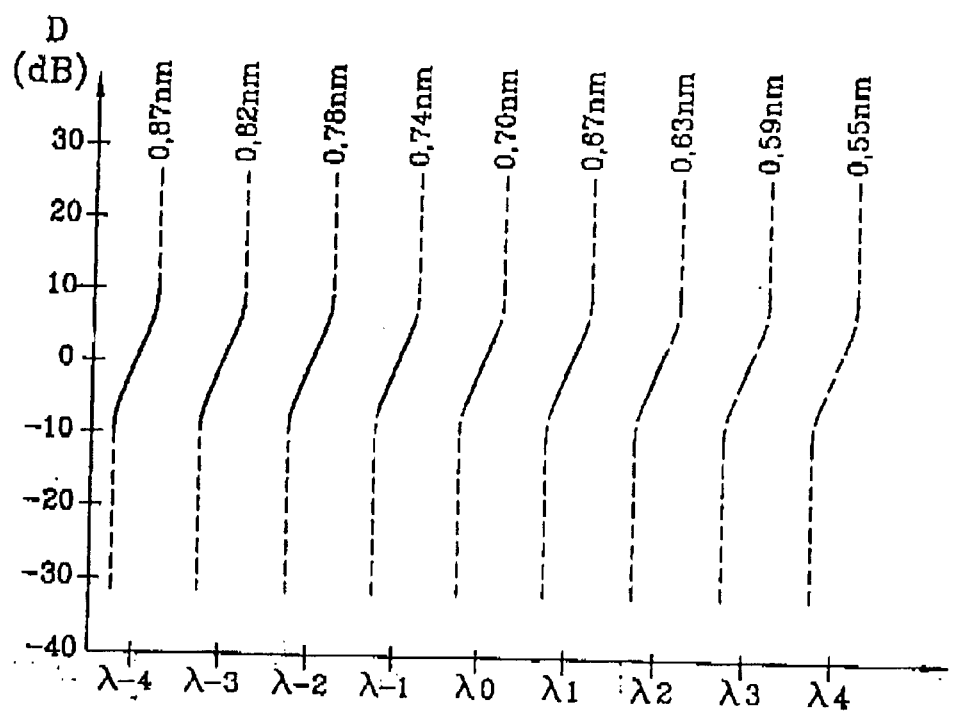
FIG. 5 shows the discrimination functions Di for the emission wavelengths of the lasers in question.

FIG. 5 illustrates the discrimination functions D for the wavelength values in question. It will be noted that the spectral control extent (indicated above each curve) is different for each transmission wavelength of the lasers because of the chromatic dispersion introduced by the device.

Figure 6:
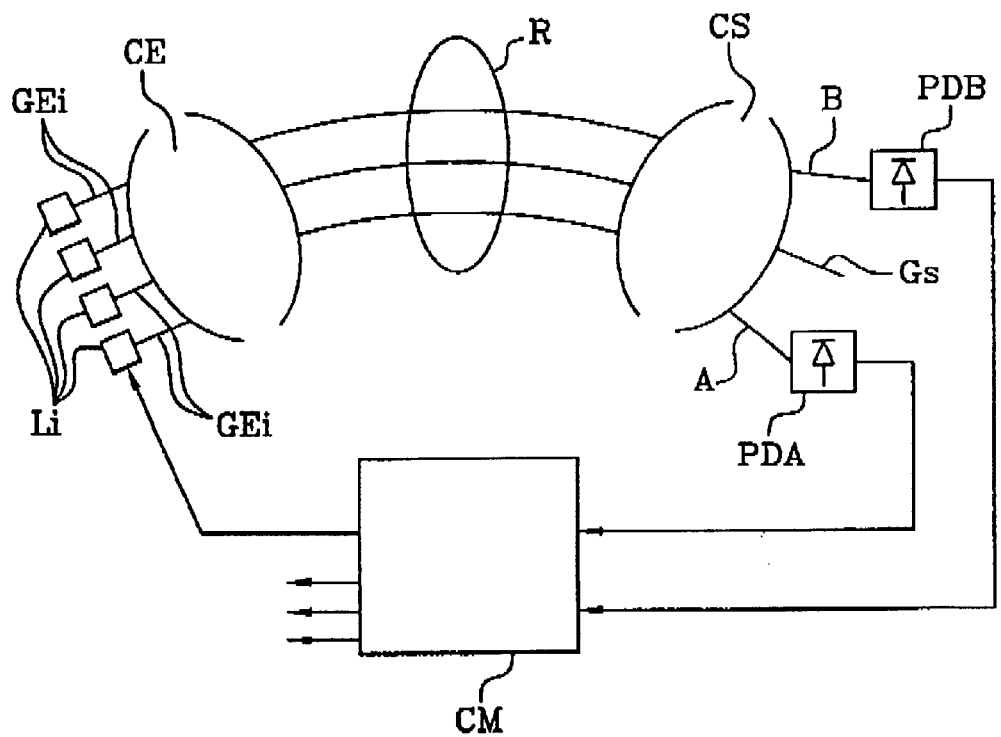
FIG. 6 depicts a system for monitoring monochromatic sources according to the invention.

In order to correct the wavelengths of the monochromatic sources according to the differences revealed by the comparisons, a monitoring system is produced as shown in FIG. 6.

The sources Li coupled to the input ports Gei can be lasers modulated by direct control of their supply current or continuous emission lasers associated with electro-optical modulators.

Photodetectors PDA and PDB are coupled respectively to the secondary output ports A and B. Electronic control means CM have inputs connected to the photodetectors PDA, FDB and outputs controlling the wavelengths of the sources Li. These outputs control for example the temperature or supply current of the source to be monitored.

The most simple way for effecting the monitoring consists of stopping the functioning of all the sources, except the one to be monitored, and then adjusting the monitoring parameter of the source so as to cancel out the function D corresponding to the nominal wavelength value allocated to the source. These operations are performed after a prior calibration of the phasar by means of a reference source whose wavelength is known with precision (for example the $C_2H_2$ line).

It is also possible to monitor one of the sources without stopping the functioning of the other sources. For this purpose, there is applied to the source to be monitored a given frequency modulation which enables the control means CM to determine, by electronic filtering, the power of the source to be monitored.

The results indicated in the above figures were obtained for a phasar whose parameters are set out in the following tables:

| Parameters of waveguides and couplers | Value |
| --- | --- |
| Effective index of the guides GEi, GS, A, B and Gj | 3.1993 |
| Effective index in the couplers CE and CS | 3.2139 |
| Width of the size of the guided mode | 0.86 μm |
| Chromatic dispersion of the coupler CS | −0.288 1/μm |
| Chromatic dispersion of the grating R | −0.306 1/μm |

| Geometric parameters | Value |
| --- | --- |
| Distance between the guides GEi (or GS and A and GS and B) at the coupler CE (or CS) | 6 μm |
| Distance dN between 2 adjacent guides Gj | 3 μm |
| Focal length f of the couplers CE and CS | 338.809 μm |
| ΔL between 2 adjacent guides Gj | 44.8242 μm |
| Interference order m | 93 |
| Number N of guides Gj of the grating R | 60 |

The wavelength values of the emission comb in question $\lambda_{-4}, \ldots, \lambda_0, \ldots, \lambda_4$ are, in nm:

| $\lambda_{-4}$ | $\lambda_{-3}$ | $\lambda_{-2}$ | $\lambda_{-1}$ | $\lambda_{-0}$ | $\lambda_{-1}$ | $\lambda_{-2}$ | $\lambda_{-3}$ | $\lambda_{-4}$ |
| --- | --- | --- | --- | --- | --- | --- | --- | --- |
| 1548.4 | 1546.8 | 1545.2 | 1543.6 | 1542.0 | 1540.4 | 1538.8 | 1537.2 | 1535.6 |

What is claimed is:

1. A device for comparing between N nominal wavelength values and the wavelength values of optical signals coupled respectively with input ports of a phasar with a grating of guides, the said phasar comprising a main output port designed to collect the combination of the said signals, the said main output port being placed at a focal point corresponding to a given interference order m of the grating, characterized in that the phasar comprises two secondary monitoring output ports respectively placed in the vicinity of focal points corresponding to the interference orders m−1 and m+1 of the grating.

2. A device according to claim 1, characterized in that the positions of the secondary output ports are adjusted so that the difference between the two transmission functions of the phasar for the output ports, referred to as the discrimination function, are zero for all the nominal wavelength values and bijective according to the wavelength value around the nominal value of the wavelength most dispersed by the grating at orders m−1 and m+1.

3. A device according to claim 2, characterized in that the positions of the secondary output ports are adjusted so that, for all the nominal wavelength values, the difference between the wavelength value of the maximum of the transmission curve and the wavelength value of the maximum of the transmission curve is situated at the upper limit of a minimum difference.

4. A device according to claim 1, characterized in that it has photodetectors coupled respectively with the two secondary output ports.

5. A monochromatic source monitoring system, characterized in that it has a comparison device according to claim 4, whose input ports are coupled respectively with the said sources, and control means for adjusting the wavelength of at least one of the said sources according to the electrical signals supplied by the said photodetectors.

* * * * *